United States Patent [19]

Goldman et al.

[11] Patent Number: 4,498,223

[45] Date of Patent: Feb. 12, 1985

[54] METHOD OF FABRICATION OF MONOLITHIC INTEGRATED CIRCUIT STRUCTURE

[75] Inventors: Ernest A. Goldman, Stow; Jeremiah P. McCarthy, Framingham; Paul E. Poppert, Acton, all of Mass.

[73] Assignee: GTE Laboratories Incorporated, Waltham, Mass.

[21] Appl. No.: 371,326

[22] Filed: Apr. 23, 1982

[51] Int. Cl.³ .......................................... H01L 21/265
[52] U.S. Cl. ...................................... 29/571; 29/578; 29/580; 29/576 B; 148/187
[58] Field of Search ............. 29/571, 578, 580, 576 B; 148/187; 357/42

[56] References Cited

U.S. PATENT DOCUMENTS

| | | | |
|---|---|---|---|
| 4,069,067 | 1/1978 | Ichinohe | 148/1.5 |
| 4,280,272 | 7/1981 | Egawa et al. | 29/571 |
| 4,315,781 | 2/1982 | Henderson | 29/571 X |
| 4,329,706 | 5/1982 | Crowder et al. | 29/571 X |
| 4,333,099 | 1/1982 | Tanguay et al. | 357/42 X |
| 4,385,433 | 5/1983 | Ozawa | 29/571 X |
| 4,420,344 | 12/1983 | Davies | 29/571 X |
| 4,425,700 | 1/1984 | Sasaki et al. | 29/571 |
| 4,433,468 | 2/1984 | Kawamata | 29/571 |
| 4,441,247 | 4/1984 | Gargini et al. | 29/571 |

Primary Examiner—G. Ozaki
Attorney, Agent, or Firm—David M. Keay

[57] ABSTRACT

A body of silicon has sectors of N-type and P-type covered by silicon oxide gate layers with adjacent regions covered by a thicker silicon oxide field layer. Gate members of N-type polycrystalline silicon are placed on the gate layers to define an N-type channel region in the N-type sector and a P-type channel region is the P-type sector. P-type conductivity imparting material is introduced into the remaining regions of the N-type sector to convert them to P-type source/drain regions with an intervening N-type channel region, and N-type conductivity imparting material is introduced into the remaining regions of the P-type sector to convert them to N-type source/drain regions with an intervening P-type channel region. The exposed silicon oxide is grown to a thicker field layer and a protective oxide is formed on the polycrystalline gate members. The source/drain regions are exposed and adherent contact members of polycrystalline silicon of N and P-type are formed in ohmic contact with the source/drain regions of N and P-type, respectively. The surfaces of the polycrystalline contact members are metallized thereby shorting out rectifying junctions between N and P-type contact members.

4 Claims, 6 Drawing Figures

METHOD OF FABRICATION OF MONOLITHIC INTEGRATED CIRCUIT STRUCTURE

BACKGROUND OF THE INVENTION

This invention relates to monolithic integrated circuit structures. More particularly, it is concerned with complementary metal-oxide-silicon (CMOS) integrated circuit structures and methods of fabricating.

In integrated circuit structures polycrystalline silicon is frequently used to make ohmic connections to underlying active regions of single crystal silicon. Such polycrystalline connections are particularly useful when employed in conjunction with shallow junction devices because metallization techniques might produce metallic spikes which short out the junction.

In order to obtain proper ohmic connection, the polycrystalline material must be of the same conductivity type as the region of the single crystal material which it contacts. That is, N-type polycrystalline material must be used to contact N-type regions and P-type polycrystalline material must be used to contact P-type regions. Thus, for CMOS structures which have active regions of both N and P-type material both N and P-type polycrystalline material must be employed. A rectifying junction is formed where the two types of polycrystalline material meet. The rectifying junctions must be shorted out by overlying conductive material.

Thus, it is desirable that techniques of fabricating integrated circuit structures of the CMOS type permit the utilization of polycrystalline connections of both conductivity types together with suitable metallization to short out junctions. In addition, the techniques should permit precise control of the channel regions and the gate electrode structures of the MOS field effect transistors (FET's).

SUMMARY OF THE INVENTION

An improved method of fabricating integrated circuit structures in accordance with the present invention comprises providing a body of semiconductor material having a first region of one conductivity type encircled by semiconductor material of the opposite conductivity type inset at a surface of the body and having a second region of the opposite conductivity type encircled by semiconductor material of the one conductivity type inset at the surface of the body. An adherent layer of protective material is formed on the surface of the body with a first opening therein exposing a portion of the first region and a second opening therein exposing a portion of the second region. An adherent member of semiconductor material of the one conductivity type and of low resistivity is then formed on the exposed portion of the first region in ohmic contact therewith and an adherent member of semiconductor material of the opposite conductivity type and of low resistivity is formed on the exposed portion of the second region in ohmic contact therewith. The member of semiconductor material of the one conductivity type and the member of semiconductor material of the opposite conductivity type extend over portions of the layer of protective material and are contiguous at a junction. An adherent layer of highly conductive material is formed on and in ohmic contact with both the member of semiconductor material of the one conductivity type of low resistivity and the member of semiconductor material of the opposite conductivity type of low resistivity in the regions in which they are contiguous, thereby shorting out the rectifying junction between them.

An improved monolithic integrated circuit structure in accordance with the invention comprises a body of semiconductor material with a first region of one conductivity type encircled by semiconductor material of the opposite conductivity type inset at a surface of the body and with a second region of the opposite conductivity type encircled by semiconductor material of the one conductivity type inset at the surface of the body. An adherent layer of a protective material on the surface of the body has a first opening therein exposing a portion of the first region and has a second opening therein exposing a portion of the second region. An adherent member of semiconductor material of the one conductivity type of low resistivity is in ohmic contact with the exposed portion of the first region. An adherent member of semiconductor material of the opposite conductivity type of low resistivity is in ohmic contact with the exposed portion of the second region. The members of semiconductor material of the one conductivity type and of the opposite conductivity type extend over portions of the layer of protective material and are contiguous at a junction. An adherent layer of highly conductive material is located on and in ohmic contact with the member of semiconductor material of the one conductivity type and on and in ohmic contact with the member of semiconductor material of the opposite conductivity type in the regions of the members of semiconductor material in which they are contiguous, thereby shorting out the rectifying junction therebetween.

More specifically in fabricating a monolithic integrated circuit structure incorporating complementary metal-oxide-silicon field effect transistors (CMOS FET's) the method in accordance with the present invention comprises providing a body of semiconductor material having a first section of one conductivity type and a second section of the opposite conductivity type at a surface of the body. A first sector within the first section and a second sector within the second section are covered by an adherent gate layer of insulating material. The portions of the surface of the body contiguous with the first and second sectors are covered by an adherent field layer of insulating material which is thicker than the gate layer. A first gate member of semiconductor material of low resistivity is placed over a portion of the gate layer of insulating material overlying a channel region of the first sector with the channel region lying between two remaining regions of the first sector. A second gate member of semiconductor material of low resistivity is placed over a portion of the gate layer of insulating material overlying a channel region of the second sector with the channel region lying between two remaining regions of the second sector. Conductivity type imparting material of the opposite conductivity type is introduced into the two remaining regions of the first sector and conductivity type imparting material of the one conductivity type is introduced into the two remaining regions of the second sector. The outer surfaces of the first and second gate members except at the interface with the underlying gate layer of insulating material are converted to adherent insulating material, and the thickness of the gate layer of insulating material overlying the remaining regions of the first and second sectors is increased to form a field layer. A portion of the field layer of insulating material overlying each of the remaining regions of the first and second sectors is removed to expose a surface area in each of the remaining regions. Adherent contact members of semiconductor material of the opposite conductivity type of low resistivity are formed on the exposed surface areas of the two remaining regions of the opposite conductivity type in the first sector in ohmic contact therewith and extending over the field layer of insulating material. Adherent contact members of semiconductor material of the one conductivity type of low resistivity are formed on the exposed surface areas of the two remaining regions of the one conductivity type in the second sector in ohmic contact therewith and extending over the field layer of insulating material. One of the contact members of semiconductor material of the one conductivity type is contiguous with one of the contact members of semiconductor material of the opposite conductivity type at a junction. An adherent layer of highly conductive material is formed on and in ohmic contact with the one contact member of semiconductor material of the one conductivity type and on and in ohmic contact with the one contact member of semiconductor material of the opposite conductivity type in the regions of the contact members in which they are contiguous, thereby shorting out the rectifying junction between them.

Monolithic integrated circuit structure incorporating CMOS FET's comprises a body of semiconductor material having a first section of one conductivity type and a second section of the opposite conductivity type at a surface of the body. A first and a second region of the opposite conductivity type are inset in the first section and define a third region of the one conductivity type between them. A first and a second region of the one conductivity type are inset in the second section and define a third region of the opposite conductivity type between them. A gate layer of insulating material overlies the third region in the first section and a gate layer of insulating material overlies the third region in the second section. A first gate member of semiconductor material of low resistivity overlies a major portion of the third region in the first section with the gate layer of insulating material interposed between them. A second gate member of semiconductor material of low resistivity overlies the major portion of the third region in the second section with the gate layer of insulating material being interposed between them. An adherent field layer of insulating material on the surface of the body has an opening exposing a portion of the first region in the first section, an opening exposing a portion of the second region in the first section, an opening exposing a portion of the first region in the second section, and an opening exposing a portion of the second region in the second section. Adherent contact members of semiconductor material of the opposite conductivity type of low resistivity are in ohmic contact with the exposed portions of the first and second regions in the first section and extend over the field layer of insulating material. Adherent contact members of semiconductor material of the one conductivity type of low resistivity are in ohmic contact with the exposed portions of the first and second regions in the second section and extend over the field layer of insulating material. One of the contact members of semiconductor material of the one conductivity type is contiguous with one of the contact members of semiconductor material of the opposite conductivity type at a junction. An adherent layer of highly conductive material is in ohmic contact with the one of the contact members of semiconductor material of the one conductivity type and the one of the contact members of semiconductor material of the opposite conductivity type in the regions in which they are contiguous, thereby shorting out the rectifying junction between them.

In the figures the various elements are not drawn to scale. Certain dimensions are exaggerated in relation to other dimensions in order to present a clearer understanding of the invention.

For a better understanding of the present invention together with other and further objects, advantages, and capabilities thereof, reference is made to the following discussion and appended claims in connection with the above-described drawings.

DETAILED DESCRIPTION OF THE INVENTION

In fabricating a monolithic integrated circuit structure containing complementary metal-oxide-silicon field effect transistors (CMOS FET's) in accordance with the invention as illustrated in the figures a substrate of single crystal semiconductor material of one conductivity type is provided as a supporting structure. As is well-understood, the substrate is usually a slice or wafer of relatively large surface area upon which many identical circuit networks each including many devices are fabricated simultaneously. However, for purposes of illustration the fabrication of only two complementary FET's in a fragment of a slice will be shown and described. In the following description silicon is employed as the semiconductor material and the starting substrate is of N-type conductivity.

Figure 1:
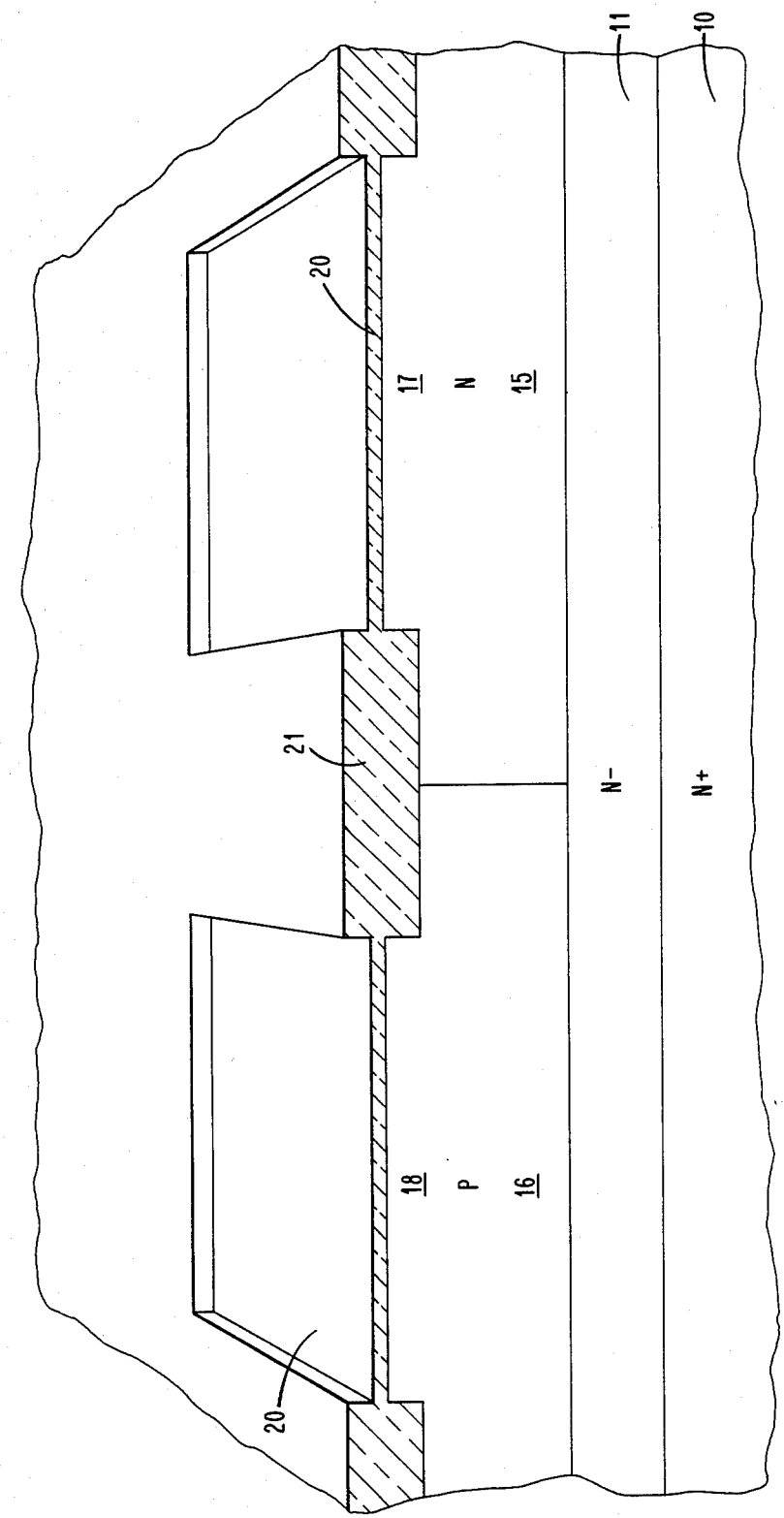
FIGS. 1-6 are a series of perspective views in crossection of a fragment of a wafer of silicon illustrating the fragment at various stages during the fabrication of complementary MOS FET's in accordance with the present invention.

A slice or wafer of N-type single crystal silicon of uniform resistivity having flat, planar, parallel, opposed major surfaces, a fragment 10 of which is illustrated in FIG. 1, is produced by any of the known techniques of crystal fabrication including appropriate slicing and cleaning operations. An epitaxial layer 11 of N-type silicon of uniform, moderate resistivity is grown on the surface of the substrate as by known vapor decomposition techniques. A layer 11 which is precisely controlled as to thickness and as to resistivity and which is a continuation of the crystalline structure of the single crystal substrate 10 is thus deposited on the surface of the substrate. The upper surface of the epitaxial layer 11 is parallel to the interface between the substrate and the layer.

Next, a layer of silicon oxide and a layer of silicon nitride are deposited on the surface of the layer. Silicon nitride is selectively removed in order to provide a suitable pattern through which phosphorus and boron are implanted so as to provide sections of N-type conductivity 15 and P-type conductivity 16. Known techniques of depositing silicon oxide and silicon nitride and of suitably masking and etching to remove the oxide and nitride in the desired pattern as well as known techniques of ion implanting conductivity type imparting materials are employed.

After the sections 15 and 16 are formed, all the remaining nitride and oxide are removed leaving a bare surface on the silicon fragment. A thin layer of silicon oxide is then deposited followed by the deposition of a thin silicon nitride layer. The silicon nitride is removed except at certain areas to define sectors within the N and P-type sections 15 and 16. The slice is then treated in a suitable oxidizing atmosphere to grow silicon oxide so as to provide a field oxide layer 21 except at the areas protected by silicon nitride. The remaining silicon nitride and the thin silicon oxide are removed to expose the sectors 17 and 18 of the N and P-type sections 15 and 16. A thin carefully controlled silicon oxide gate layer 20 is then grown to provide the gate insulating structure over the sectors. The slice may then be exposed to ion implantation of appropriate conductivity type imparting material to adjust the threshold voltages of any or all devices to the proper level. The resulting fragment is illustrated in FIG. 1 showing the sectors 17 and 18 of N and P-type conductivity with a thin gate insulating layer 20 overlying their surfaces and with a thick field oxide layer 21 lying over the remainder of the sections 15 and 16. The techniques employed in fabricating the structure to the stage illustrated in FIG. 1 are well-known standard processing techniques widely used throughout the semiconductor industry.

Figure 2:
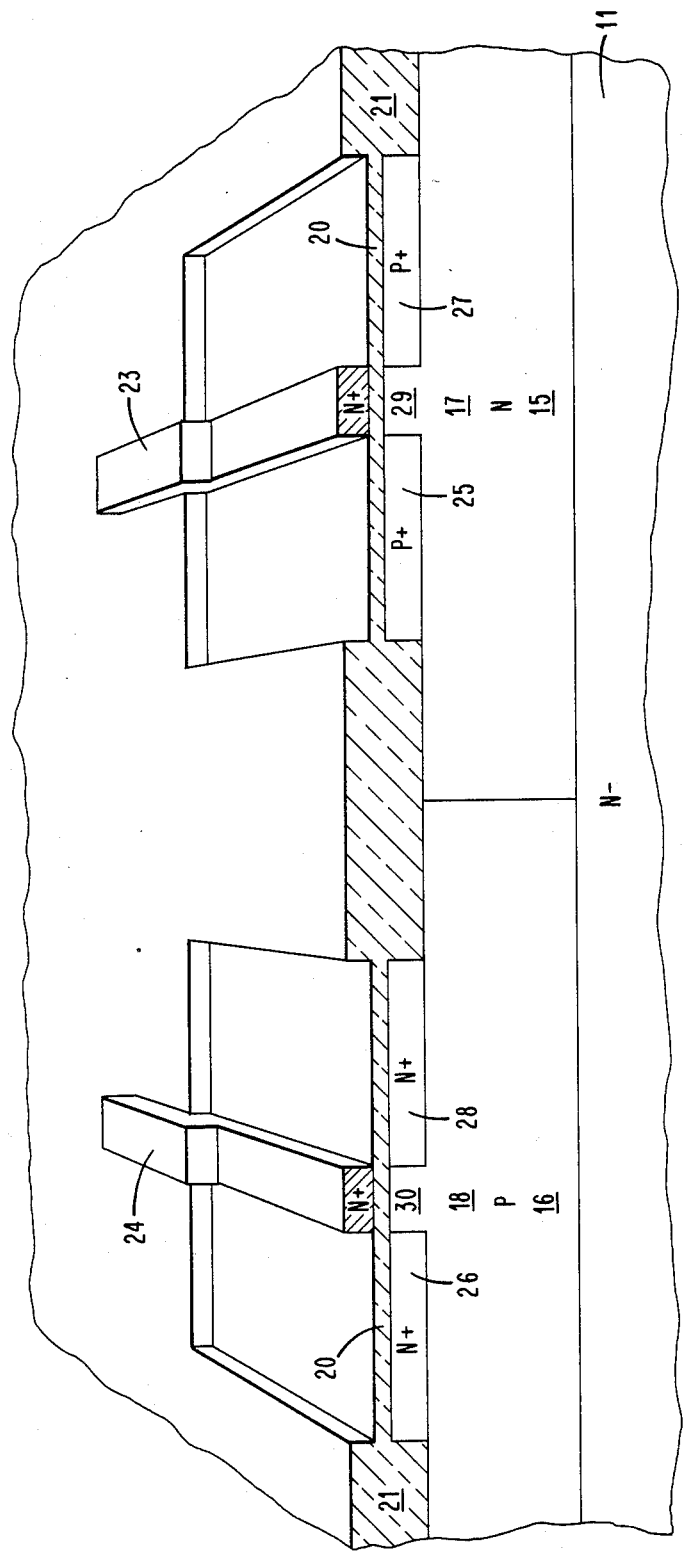

Next, a layer of polycrystalline silicon which adheres to the silicon oxide is deposited on the slice. The polycrystalline silicon is treated to introduce N-type conductivity imparting material, specifically phosphorus, to product a polycrystalline silicon layer of low resistivity. Polycrystalline silicon of the layer is then removed by appropriate masking and etching steps to produce gate electrodes 23 and 24 as shown in FIG. 2. By employing conventional ion implantation techniques and masking where necessary P-type conductivity imparting material is introduced into regions 25 and 27 of the first sector 17 not shielded by the gate electrode 23 and the encircling field oxide 21. N-type conductivity imparting material is implanted into regions 26 and 28 of the second sector 18 not shielded by the gate electrode 24 and the encircling field oxide 21. The gate electrode 23 of low resistivity polycrystalline silicon defines and overlies a channel region 29 of N-type conductivity with an insulating layer 20 between them as shown in FIG. 2. The remainder of the first sector 17 is formed into P-type source/drain regions 25 and 27. Similarly, gate electrode 24 defines P-type channel region 30 between N-type source/drain regions 26 and 28.

Figure 3:
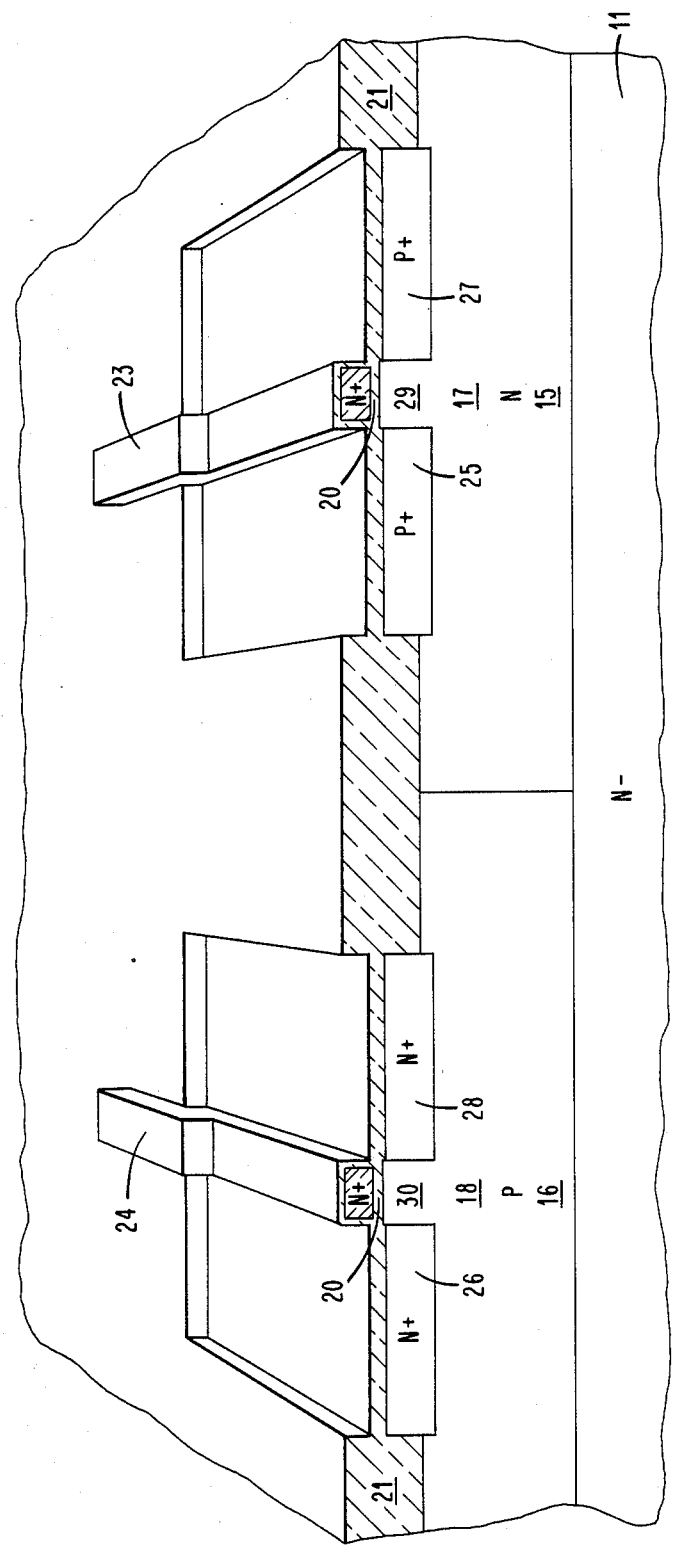

The slice having the structure of CMOS FET's as illustrated in the fragment of FIG. 2 is subjected to appropriate annealing steps to drive the implanted conductivity type imparting materials farther into the respective regions as is well-known in the art. The slice is then subjected to an oxidizing atmosphere in a known manner to increase the thickness of the exposed oxide layers. Thus, the field oxide 21 becomes thicker and the thin oxide overlying the first and second sectors other than the gate oxide between the gate electrodes 23 and 24 and the respective channel regions 29 and 30 also becomes thicker and may be considered as field oxide. At the same time the exposed outer surfaces of the polycrystalline silicon gate electrodes 23 and 24, but not the interface with the gate oxide 20, become oxidized producing an insulating layer around the gate electrodes as illustrated in FIG. 3.

Figure 4:
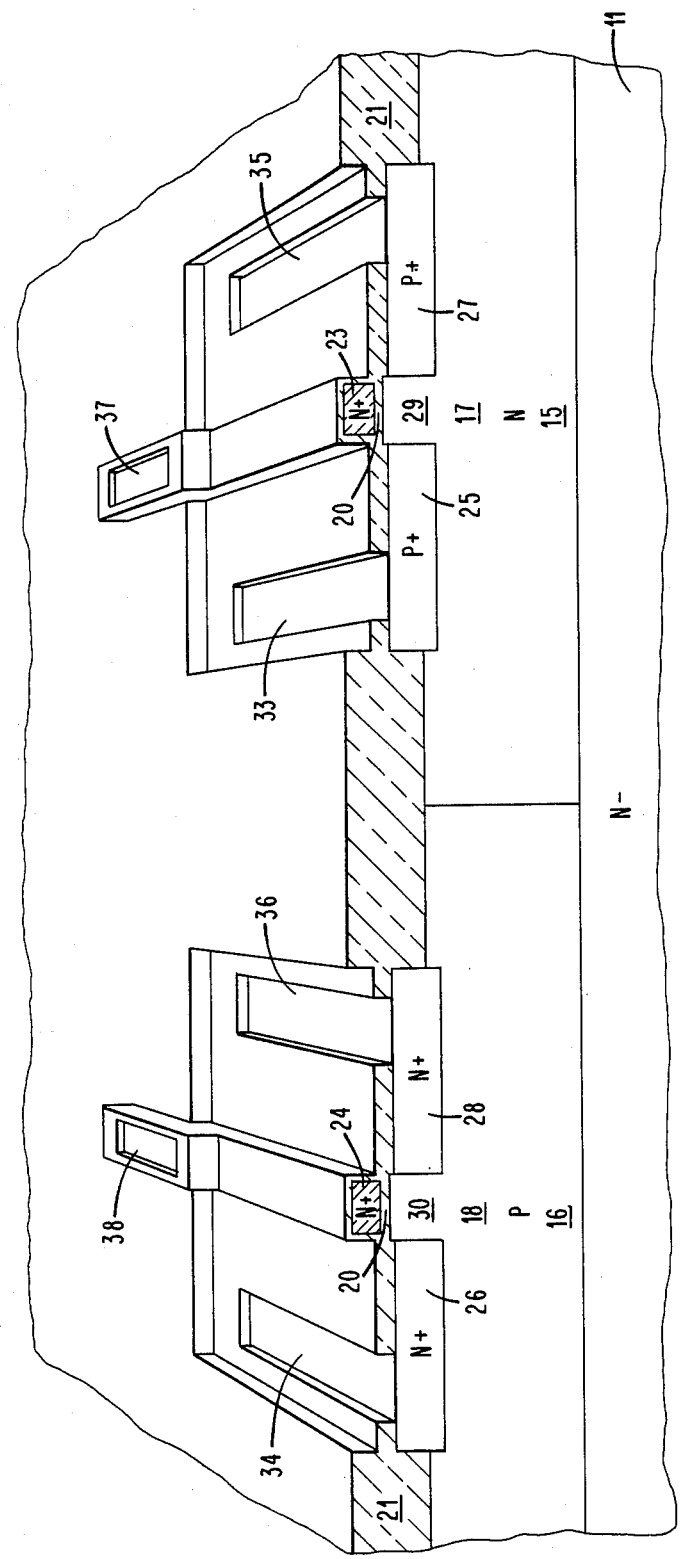

Next, as illustrated in FIG. 4, by employing conventional masking and etching techniques, silicon oxide of the field layer is selectively removed to provide openings 33 and 35 exposing portions of regions 25 and 27 and openings 34 and 36 exposing portions of regions 26 and 28. At the same time openings 37 and 38 are formed through the oxide insulating layer of the gate electrodes 23 and 24 to expose portions of the underlying low resistivity N-type polycrystalline material.

Polycrystalline silicon is deposited over the surface of the wafer. The polycrystalline layer is suitably masked and N and P-type conductivity imparting materials are implanted therein to render the material conductive. In order for the connections to underlying silicon to be ohmic the portions of the layer making contact to underlying P-type silicon are made P-type and the portions making contact to underlying N-type silicon, whether a single crystal or polycrystalline, are made N-type. The surface of the polycrystalline silicon layer is then suitably metallized as by employing known techniques of forming a silicide of a refractory metal, for example tungsten or tantalum. Portions of the polycrystalline silicon layer and the metallized surface are then selectively removed to leave the resulting structure as illustrated in FIG. 5.

Figure 5:
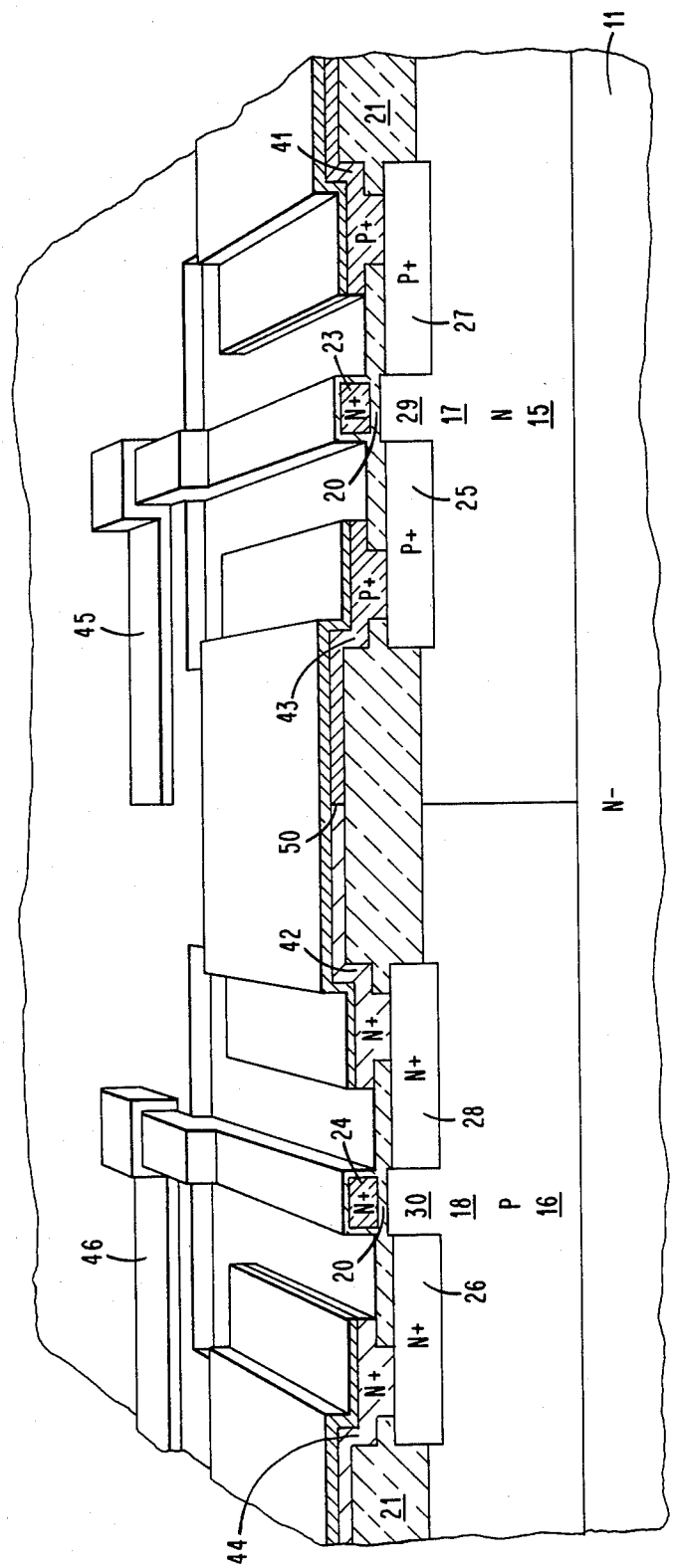

As shown in FIG. 5 a P-type polycrystalline silicon contact member 41 with overlying metallization makes ohmic contact to one of the source/drain regions 27 of P-type material. A P-type polycrystalline silicon contact member 43 with overlying metallization makes ohmic contact with the other P-type source/drain region 25. An N-type polycrystalline silicon contact member 42 with overlying metallization makes ohmic contact to one of the N-type source/drain regions 28 and an N-type silicon contact member 44 with metallization is in ohmic contact with the other N-type source/drain region 26. N-type gate contact members 45 and 46 make contact to the N-type material of the gate electrodes 23 and 24. As can be seen in FIG. 5 two of the polycrystalline silicon contact members 43 and 42 which interconnect the source/drain regions 25 and 28 of the complementary FET's meet at a rectifying junction 50. The metallization on the surface of the contact members 42 and 43, however, is highly conductive, thereby shorting out the rectifying junction 50.

Figure 6:
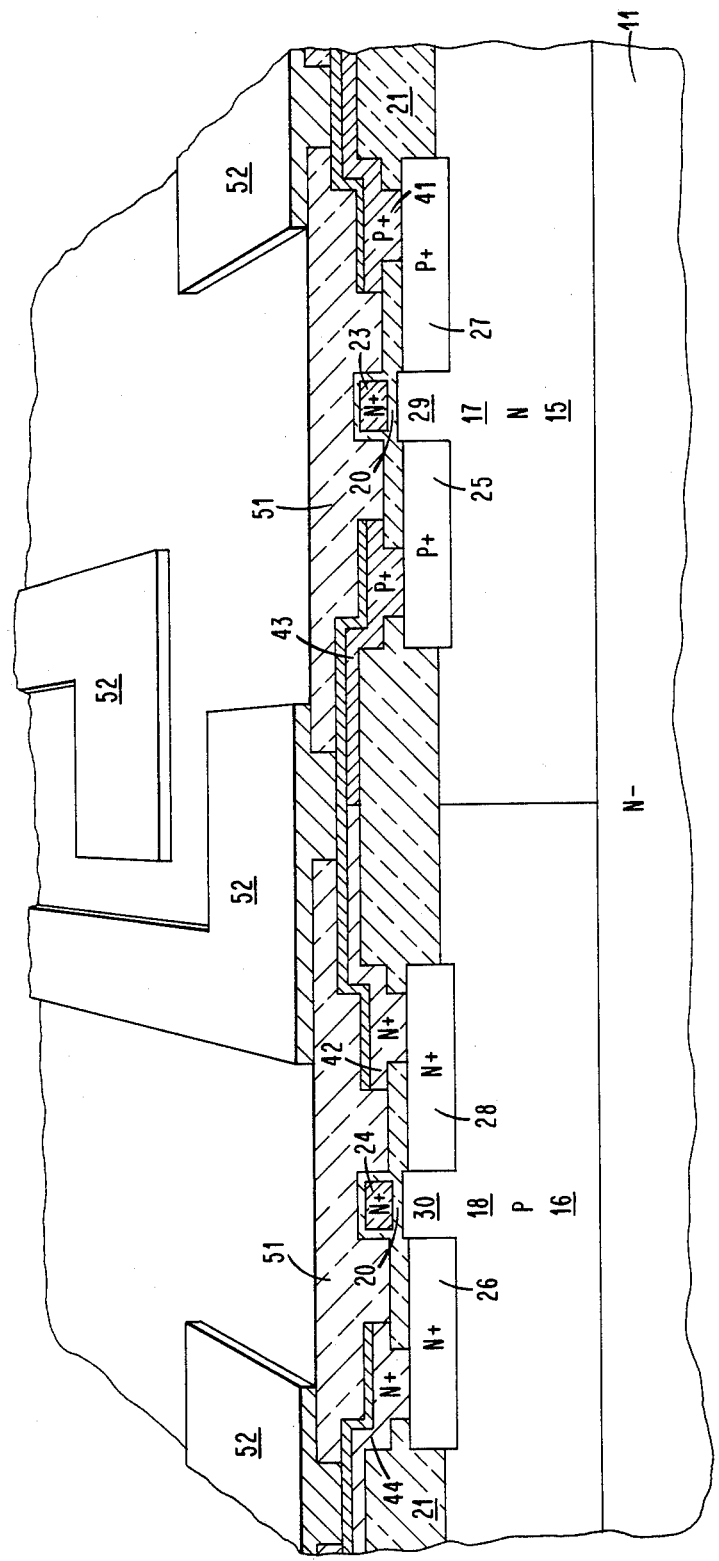

In order to complete the integrated circuit structure a layer of silicon oxide 51 is deposited over the entire surface to provide a smooth, planar surface as shown in FIG. 6. Openings are formed in the layer 51 to expose selected portions of the underlying metallized polycrystalline silicon contact members 41–44. Metal interconnections 52 are then formed by suitable deposition, masking, and etching techniques of a metal, specifically aluminum, to complete the connections to the elements of the integrated circuit.

In integrated circuit structures as described the P-type source/drain regions 25 and 27 typically have a resistivity of 60–100 ohms per square and the N-type source/drain regions 26 and 28 have a resistivity of 30–50 ohms per square. The polycrystalline material of the gate electrodes 23 and 24 and of the contact members 41–44 typically is of 50–100 ohms per square resistivity and the metallization over the members is of 1–2 ohms per square resistivity.

The method as described provides interconnecting members of polycrystalline silicon of appropriate conductivity type of making ohmic contact to both N and P-type regions. A highly conductive metallized layer shorts out rectifying junctions. The gate electrodes are defined separately from the interconnecting contact members and are subject to close geometrical control. The relationship between the gate electrodes and the underlying gate insulating material may be closely controlled because there are no processing steps between the deposition of the gate oxide layer and the deposition of the polycrystalline silicon of the gate electrodes. The conductivity type imparting materials for the source/drain regions are implanted after formation of the gate insulating layer and gate electrodes with the gate electrodes defining the width of the channel regions. The polycrystalline. interconnecting contact members and the refractory metallized high conductivity surfaces are compatible with subsequent processing to form the smoothing oxide and the final metal interconnections.

While there has been shown and described what is considered a preferred embodiment of the present invention, it will be obvious to those skilled in the art that various changes and modifications may be made therein without departing from the invention as defined by the appended claims.

What is claimed is:

1. The method of fabricating monolithic integrated circuit structure incorporating complementary field effect transistors comprising providing a body of semiconductor material having a first section of one conductivity type and a second section of the opposite conductivity type at a surface of the body with a first sector within said first section and a second sector within said second section covered by an adherent gate layer of insulating material, the portions of the surface of the body contiguous with said first and second sectors being covered by an adherent field layer of insulating material thicker than the gate layer of insulating material;

placing a first gate member of semiconductor material of low resistivity over a portion of the gate layer of insulating material overlying a channel region with said channel region lying between two remaining regions of said first sector, and a second gate member of semiconductor material of low resistivity over a portion of the gate layer of insulating material overlying a channel region of said second sector with said channel region lying between two remaining regions of said second sector;

introducing conductivity type imparting material of the opposite conductivity type into the two remaining regions of said first sector and introducing conductivity type imparting material of the one conductivity type into the two remaining regions of said second sector;

converting the outer surfaces of the first and second gate members except at the interface with the underlying gate layer of insulating material to adherent insulating material and increasing the thickness of the gate layer of insulating material overlying the remaining regions of the first and second sectors to form a field layer;

removing a portion of the field layer of insulating material overlying each of the remaining regions of the first and second sectors to expose a surface area in each of said remaining regions;

forming adherent contact members of semiconductor material of the opposite conductivity type of low resistivity on and in ohmic contact with the exposed surface areas of the two remaining regions of the opposite conductivity type in said first sector extending over the field layer of insulating material, and forming adherent contact members of semiconductor material of the one conductivity type of low resistivity on and in ohmic contact with the exposed surface areas of the two remaining regions of the one conductivity type in said second sector extending over the field layer of insulating material, one of the contact members of semiconductor material of the one conductivity type being contiguous with one of the contact members of semiconductor material of the opposite conductivity type at a junction; and forming an adherent layer of highly conductive material on and in ohmic contact with the one contact member of semiconductor material of the one conductivity type and on and in ohmic contact with the one contact member of semiconductor material of the opposite conductivity type in the regions of the contact members in which the one contact member of semiconductor material of the one conductivity type and the one contact member of semiconductor material of the opposite conductivity type are contiguous thereby shorting out the rectifying junction between the one contact member of semiconductor material of the one conductivity type and the one contact member of semiconductor material of the opposite conductivity type.

2. The method in accordance with claim 1 wherein
simultaneously with removing a portion of the field layer of insulating material overlying each of the remaining regions of the first and second sectors, also removing a portion of the adherent insulating material at the outer surfaces of each of the first and second gate members to expose underlying semiconductor material of low resistivity; and simultaneously with forming adherent contact members of the one conductivity type, also forming adherent first and second gate contact members of semiconductor material of the one conductivity type of low resistivity on and in ohmic contact with the exposed underlying semiconductor material of low resistivity of the first and second gate members, respectively.

3. The method in accordance with claim 2 wherein
said body of semiconductor material is of single crystal silicon; and said first gate member of semiconductor material, said second gate member of semiconductor material, said contact member of semiconductor material of the one conductivity type, and said contact member of semiconductor material of the opposite conductivity type are of polycrystalline silicon.

4. The method in accordance with claim 3 wherein
said gate layer of insulating material and said field layer of insulating material are of silicon oxide; and converting the outer surfaces of the first and second gate members to adherent insulating material and increasing the thickness of the gate layer of insulating material comprises exposing said body to an oxidizing atmosphere.

* * * * *